United States Patent
Hilton

(10) Patent No.: US 6,999,885 B2
(45) Date of Patent: Feb. 14, 2006

(54) SYSTEM AND METHOD FOR PROCESSING A PERIODIC OR CYCLOSTATIONARY SIGNAL

(75) Inventor: Howard Hilton, Snohomish, WA (US)

(73) Assignee: Agilent Technologies, Inc., Palo Alto, CA (US)

(*) Notice: Subject to any disclaimer, the term of this patent is extended or adjusted under 35 U.S.C. 154(b) by 5 days.

(21) Appl. No.: 10/825,034

(22) Filed: Apr. 15, 2004

(65) Prior Publication Data

US 2005/0234667 A1    Oct. 20, 2005

(51) Int. Cl.
G01R 29/00 (2006.01)
G06F 19/00 (2006.01)

(52) U.S. Cl. .................... 702/79; 702/125
(58) Field of Classification Search .......... 702/69, 702/74, 78, 79, 123, 124, 125, 126; 324/76.28, 324/76.47, 76.48; 341/123, 126

See application file for complete search history.

(56) References Cited

U.S. PATENT DOCUMENTS 5,721,689 A * 2/1998 Hart et al. ............... 702/75
6,067,411 A * 5/2000 Poimboeuf et al. ........ 713/400
6,463,091 B1 * 10/2002 Zhodzicshsky et al. ..... 375/149

FOREIGN PATENT DOCUMENTS

| GB | 2206757 A | 7/1988 |
| JP | 63228076 A | 9/1988 |
| JP | 09005362 A | 1/1997 |

* cited by examiner

Primary Examiner—Bryan Bui

(57) ABSTRACT

In one representative embodiment, multiple ensembles of samples of a periodic or cylcostationary signal are processed in a time aligned manner. The sampling rate of the processing system is adjusted so that an integer number of sampling intervals equals the period of the signal. A cyclic counter is programmed to reset according to the integer number. Also, the cyclic counter may be initialized according to an external trigger. During operation, the cyclic counter is incremented when each sample is received. Continuous operation of the cyclic counter with the capturing of samples enables precise time alignment between ensembles of samples. Specifically, the beginning of a discrete ensemble is identified by a reset of the cyclic counter. Because each ensemble is time aligned, further processing (e.g., coherent averaging) may occur without post-processing to time-shift each sample to achieve the time alignment.

20 Claims, 2 Drawing Sheets

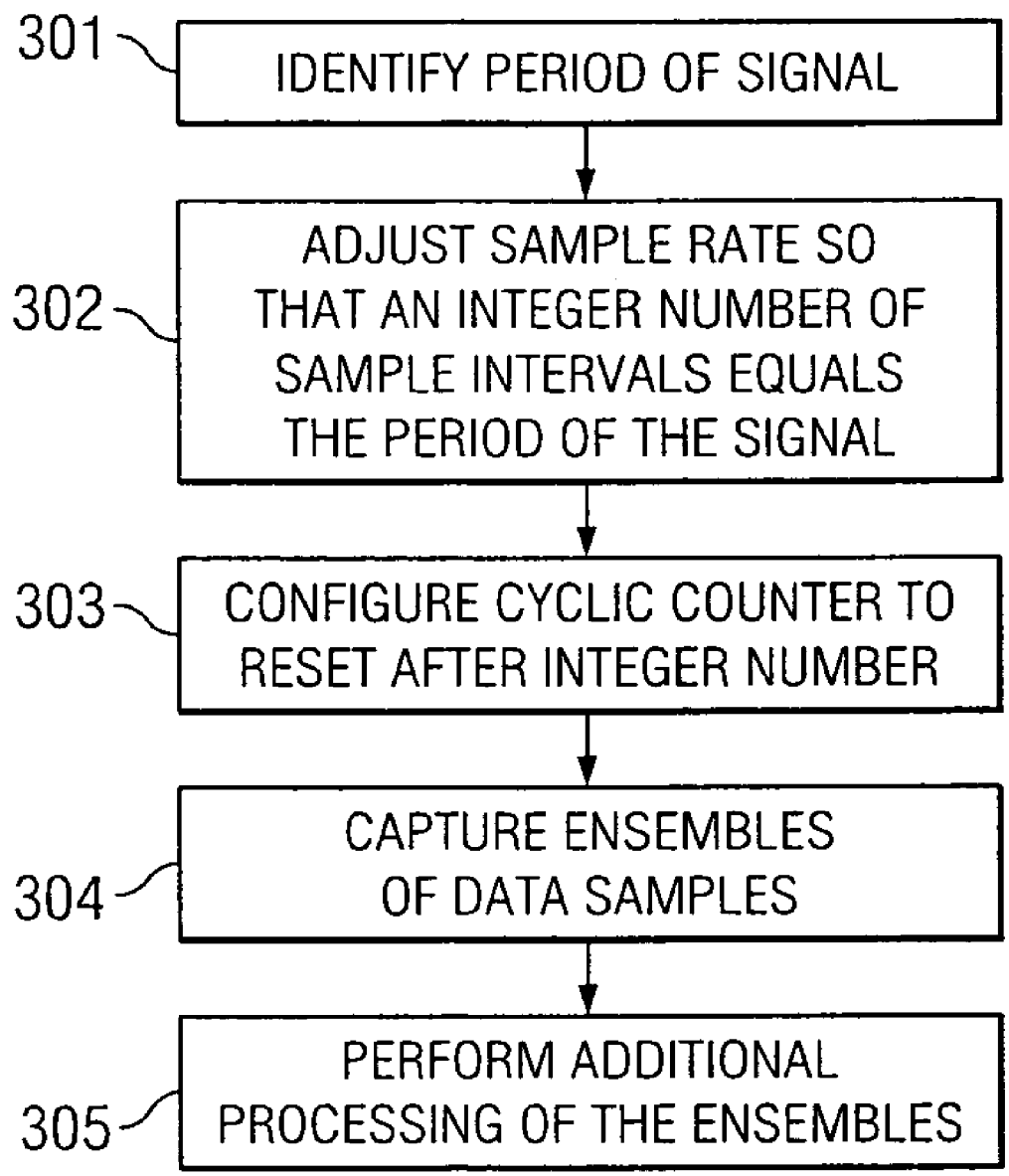

SYSTEM AND METHOD FOR PROCESSING A PERIODIC OR CYCLOSTATIONARY SIGNAL

TECHNICAL FIELD

The present invention is generally related to analysis or similar processing of period or cyclostationary signals.

BACKGROUND

Instruments such as oscilloscopes, spectrum analyzers, modulation analyzers, and vector signal analyzers, normally implement a trigger mechanism to align the beginning of a viewing and analysis interval with a particular instant in time. This desired trigger time may be identified by a separate "trigger input" signal. It may also be based on an attribute of the input signal such as the crossing of a particular voltage or power level. Virtually all of these instruments enable the selection of the type or source of the trigger signal and the related signal attributes such as threshold and polarity.

The precision of the trigger timing is complicated by the fact that most instruments convert the input signal to digital form by sampling the input signal at uniform time intervals. If the desired trigger time does not precisely align with one of these samples, there is an error in the trigger timing. Unless additional measures are taken, the inherent trigger uncertainty is one period of the instrument's sample clock. In some cases, this amount of uncertainty can be tolerated. However, there are applications that require greater precision.

For example, analysis of a periodic signal or a cyclostationary signal (a signal with periodic statistics) typically involves displaying or processing ensembles of many signal periods according to accurate time alignment. An ensemble, as used herein, refers to samples of a single period of a signal. An example of analysis of multiple ensembles of signal data is coherent averaging of several periods of a signal to reduce measurement noise while retaining the underlying signal. The trigger precision requirements for periodic or cyclostationary processing often exceed the inherent limit imposed by an instrument's sample rate.

Some instruments provide a trigger interpolator which measures the time interval between an externally supplied trigger and the next available signal sample. The time offset is then used to post-process the captured data to effectively shift the time alignment to correspond to the desired trigger time. This technique has been observed to improve the effective trigger accuracy by a factor of 10 to 100. However, this technique involves added complexity for the trigger interpolation functionality. Additionally, the post-processing time can be significant. Furthermore, a degree of inaccuracy remains in the time alignment.

Techniques have been developed to extract high resolution trigger timing by post-processing the data even when an external signal is not supplied. Because the value of the offset between the sampling timing and the trigger timing is determined from the signal itself, these techniques can only be applied in a limited number of special cases. After the offset is determined, the timing offset is compensated using time consuming post-processing techniques. However, the extraction of the trigger offset can artificially skew the timing and obscure jitter effects that are present in the signal. Also, in low signal-to-noise conditions, this technique cannot be applied.

SUMMARY

Representative embodiments are directed to systems and methods for facilitating analysis of a signal. In some representative embodiments, the period of the signal is determined. The period may be defined by the interval of time between a repetition of respective phases of a deterministic signal. Alternatively, the period may be defined by the interval of time between a repetition of signal statistics for cyclostationary signals.

The sampling rate of the instrument used to capture signal samples is then adjusted so that an integer number of samples matches the determined period. The sampling rate may be adjusted using a number of mechanisms. For example, the digital clock signal that is used to control an analog-to-digital (A/D) converter may be varied using a programmable frequency synthesizer. Alternatively, the A/D converter may be operated at its optimal rate and the samples from the A/D converter may be processed by an arbitrary rate digital resampler.

A cyclic counter with a programmable modulus is configured to reset according to the integer number of samples that matches the determined period. Specifically, the cyclic counter returns to zero after the integer number of samples have been obtained. The A/D conversion and the operation of the counter mechanism continues even when data samples of the signal are not being captured for signal analysis.

An initial trigger event may be used to identify a particular digital sample as the starting point for an ensemble of measurements. The cyclic counter is initialized to zero at this point. During further operations, samples are captured between respective resets of the cyclic counter. Because of the configuration of the cyclic counter, the captured samples within each ensemble are precisely time aligned. Further processing may then occur in an efficient manner without requiring post-processing time alignment. For example, coherent averaging may occur by only adding respective ensemble data samples and appropriate scaling.

BRIEF DESCRIPTION OF THE DRAWINGS

FIG. 3 depicts a flowchart for capturing multiple ensembles of data in a time aligned manner according to one representative embodiment.

DETAILED DESCRIPTION OF THE INVENTION

Figure 1:
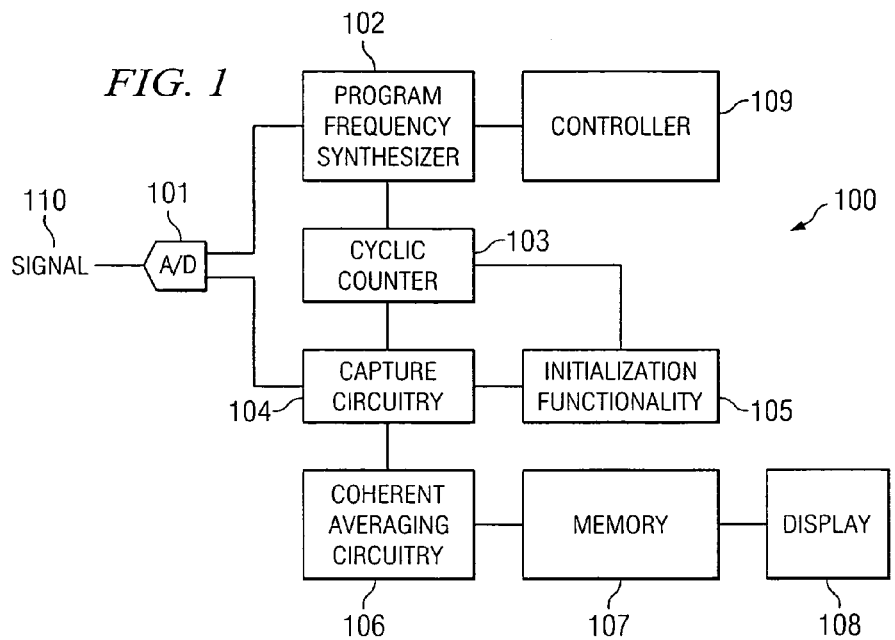
FIG. 1 depicts a system that captures multiple ensembles of data in a time aligned manner according to one representative embodiment.

Referring now to the drawings, FIG. 1 depicts system 100 that captures multiple ensembles of data in a time aligned manner according to one representative embodiment. As shown in system 100, signal 110 is received by analog-to-digital (A/D) converter 101. The sampling interval of A/D converter 101 is defined by a timing signal provided by programmable frequency synthesizer 102. Also, the timing signal generated by programmable frequency synthesizer 102 is provided to cyclic counter 103 to increment its counter value. Cyclic counter 103 possesses a programmable modulus (the value at which cyclic counter 103 resets to zero). Cyclic counter 103 may be implemented using any number of digital logic designs.

Controller 109 coordinates the operations of the various components of system 100. Controller 109 may be implemented using a processor and suitable executable instructions. Alternatively, controller 109 may be implemented using an application specific integrated circuit if desired. When samples of signal 110 are to be captured, the period of signal 110 is identified to controller 109 by analysis or using a priori knowledge. Controller 109 sets the frequency of program frequency synthesizer 102 such that A/D converter 101 samples an integer number of samples for each period of signal 110. Also, controller 109 sets the programmable modulus of cyclic counter 103 to cause a reset after the integer number of samples are captured.

For example, suppose system 100 possesses a nominal sampling rate of 10 MHz. Also, assume that signal 110 is a cyclostationary signal with a period of 1/60 second. This would result in approximately 166666.66 samples per period. Accordingly, a small adjustment can be made to the sample rate to achieve exactly 1666667 samples per second. Controller 109 determines the appropriate frequency adjustment and provides the adjustment to programmable frequency synthesizer 102. Also, controller 109 calculates the integer number of samples obtained during the period of signal 110 and loads the number into cyclic counter 103 to set the modulus. Cyclic counter 103 updates its counter in response to the timing signal received from programmable frequency synthesizer 102 and cyclically resets to zero after every 1666667 samples.

Initialization functionality 105 may be used to identify a particular sample as the sample to begin an ensemble. Initialization functionality 105 may be implemented using a typical trigger mechanism. Additionally or alternatively, initialization functionality 105 may receive user input and, in response thereto, advance or delay the trigger point (i.e., the sample identifying the beginning of an ensemble). The user can then "rotate" through the periodic signal samples until the desired alignment is obtained.

During operation, signal 110 is sampled by A/D converter 101. Cyclic counter 103 counts the number of samples, because it is coupled to programmable frequency synthesizer 102. When cyclic counter 103 resets its counter, it generates a trigger message for communication for capture circuitry 104. Capture circuitry 104 beings reading out a discrete ensemble of samples from A/D converter 101. The ensemble of data samples can then be subjected to further processing. For example, the ensemble of data samples can be provided to coherent averaging circuitry 106. Because the sample of the various ensembles are precisely temporally aligned, coherent averaging may occur in an efficient manner without requiring individual post-processing of each sample.

The coherently averaged samples can then be stored in memory 107 for later retrieval, used to display signal characteristics on display 108, and/or the like. Additionally, if a temporary cessation in sample capture occurs to perform other operations, cyclic counter 103 continues its operations to maintain synchronization to signal 110. Accordingly, when sample capturing resumes, the subsequent ensembles will be properly time aligned with prior ensembles.

Figure 2:
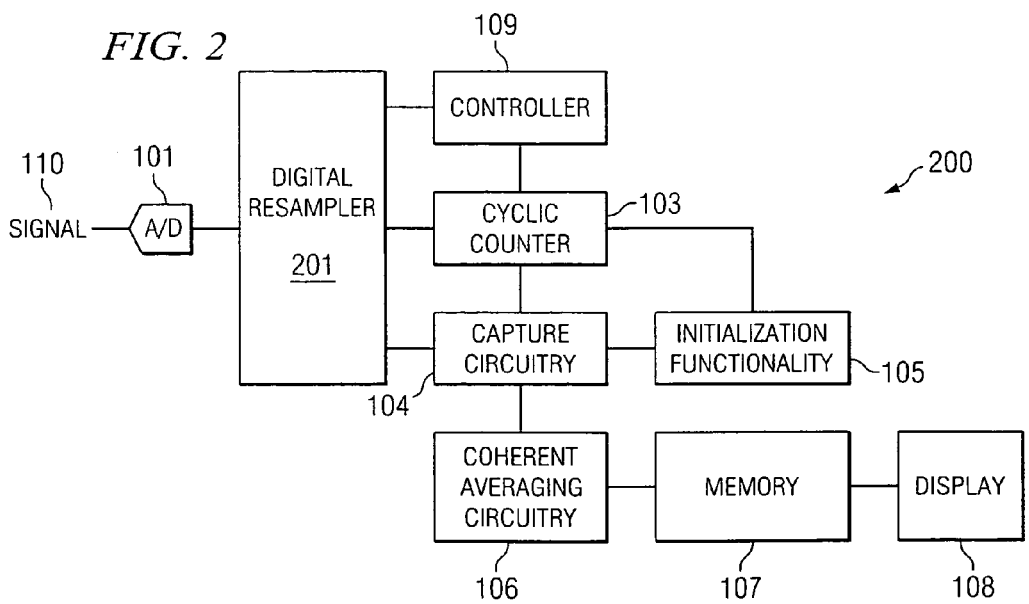
FIG. 2 depicts another system that captures multiple ensembles of data in a time aligned manner according to one representative embodiment.

FIG. 2 depicts system 200 that captures multiple ensembles of data in a time aligned manner according to another representative embodiment. System 200 operates largely in the same manner as system 100. However, in lieu of using programmable frequency synthesizer 102 to control the sampling interval of A/D converter 101, A/D converter 101 is operated using a single sampling interval. By doing so, A/D converter 101 may be operated at its optimal rate. In this case, the number of captured samples for a period of signal 110 are caused to equal the desired integer number by employing digital resampler 201. Digital resampler 201 enables a programmable reduction in the sampling rate of an input data stream. Controller 109 sets the resampling rate to achieve an integer number of samples per signal period. Also, in system 200, cyclic counter 103 is coupled to digital resampler 201 to enable the reset of cyclic counter 103 after each integer number of resampled samples are provided to capture circuitry 104.

System 200 may be appropriate for processing signals that possess relatively short signal periods. Specifically, short periods may cause the variation in the sample interval to cause operation of A/D converter 101 outside of its optimal region. Accordingly, the performance of digital resampling maintains the performance of the analog-to-digital conversion while obtaining the desired number of samples for time alignment purposes. Additionally, some digital resamplers enable the sample times to be increased or decreased by a fraction of the programmed sample interval. In conjunction with the cyclic counter adjustments, representative embodiments may use this feature of digital resamplers to obtain any desired degree of resolution in the time alignment of the cyclic counter initiated trigger relative to the input signal.

FIG. 3 depicts a flowchart for capturing multiple ensembles of data in a time aligned manner according to one representative embodiment. In step 301, the period of the signal is identified. The period may define an interval between a repetition of a phase of said signal. Alternatively, the period may define an interval between a repetition of signal stochastic properties. In step 302, the sample rate of the processing system is adjusted so that an integer number of sample intervals equals the period of the signal. The adjustment may be performed using a programmable frequency synthesizer to adjust a clock signal provided to an A/D converter. Alternatively, the adjustment may be performed using a programmable rate digital resampler. The timing of said sample rate may also be adjusted by a fraction of the period of the sample interval to achieve a desired level of resolution.

In step 303, a cyclic counter is configured to reset according to the integer number. Also, the cyclic counter may be initialized using a conventional trigger mechanism. Alternatively, a reset point of said cyclic counter may be manually or otherwise adjusted to delay or advance said trigger signal relative to the periodic signal. Each reset of the cyclic counter may be used to generate a trigger signal to initiate the capture of a respective ensemble. In step 304, ensembles of data samples of the signal are captured. Specifically, each ensemble is defined by successive resets of said cyclic counter. In step 305, additional processing of ensembles may occur such as coherent averaging.

By adjusting the sampling interval and continuously operating the cyclic counter to count captured samples, ensembles of data samples are maintained in a time aligned manner according to representative embodiments. Because post-processing time shifting is not required, hardware averaging or other suitable processing may be employed to process the ensembles in an efficient manner. Additionally, the precision of the alignment accuracy achieved by representative embodiments is only limited by the jitter limitations of the ADC sampling, which is typically in the range to $10^{-12}$ seconds. Accordingly, some representative embodiments may enable alignment accuracy to be maintained for hours or days without requiring another traditional trigger to correct the alignment.

What is claimed is:

1. A method for facilitating analysis of a signal, comprising:
   identifying a period of said signal;
   adjusting a sample rate so that an integer number of sample intervals equals said period of said signal;
   configuring a cyclic counter to reset according to said integer number; and
   capturing ensembles of data samples of said signal that are respectively defined by successive resets of said cyclic counter.

2. The method of claim 1 further comprising:
   coherently averaging captured ensembles without post-processing to time shift each sample of said captured ensembles.

3. The method of claim 1 wherein said adjusting is performed using a programmable frequency synthesizer.

4. The method of claim 1 wherein said adjusting is performed using a programmable rate digital resampler.

5. The method of claim 1 further comprising:
   generating a trigger signal for said capturing in response to a reset of said cyclic counter.

6. The method of claim 5 further comprising:
   adjusting a reset point of said cyclic counter to delay or advance said trigger signal relative to said signal.

7. The method of claim 1 further comprising:
   initializing said cyclic counter using a trigger mechanism.

8. The method of claim 1 further comprising:
   adjusting timing of said sample rate by a fraction of a period of said sample interval.

9. The method of claim 1 wherein said period of said signal defines an interval between a repetition of a phase of said signal.

10. The method of claim 1 wherein said period of said signal defines an interval between a repetition of signal stochastic properties.

11. A system for processing a signal that possesses a period, comprising:
    an analog-to-digital (A/D) converter for sampling said signal;
    sample capture circuitry for obtaining samples of said signal at a sample rate such that an integer number of sample intervals equals said period;
    cyclic counter logic that counts each captured sample and comprising a programmable modulus set to said integer number; and
    wherein said sample capture circuitry is operable to output time aligned ensembles of captured samples that are defined by respective resets of said cyclic counter logic.

12. The system of claim 11 further comprising:
    a programmable frequency synthesizer for varying a sampling rate of said A/D converter.

13. The system of claim 11 further comprising:
    digital resampling circuitry disposed between said A/D converter and said sample capture circuitry for programmably varying a rate that samples are provided to said sample capture circuitry.

14. The system of claim 13 wherein said digital resampling circuitry adjusts timing of communication of samples between said A/D converter by a fraction of a programmably variable rate of said digital resampling circuitry.

15. The system of claim 11 further comprising:
    a trigger mechanism configured to initialize said cyclic counter logic.

16. The system of claim 11 wherein said period defines a repetition between a phase of said signal.

17. The system of claim 11 wherein said period defines a repetition between signal stochastic properties.

18. A system for processing a signal that possesses a period, comprising:
    means for providing samples of said signal at a sample rate, wherein an integer number of sample intervals defined by said sample rate equals said period;
    means for cyclically counting samples such that said means for cyclically counting is reset after said integer number of sample intervals; and
    means for outputting time aligned ensembles of samples defined by respective resets of said means for cyclically counting.

19. The system of claim 18 wherein said means for providing samples comprises:
    a programmable rate digital resampler.

20. The system of claim 18 wherein said means for providing samples comprises:
    a digital to analog converter driven by a clock defined by a programmable frequency synthesizer.

* * * * *